(12) United States Patent
Jung

(10) Patent No.: US 8,159,860 B2
(45) Date of Patent: Apr. 17, 2012

(54) SEMICONDUCTOR MEMORY DEVICE HAVING A DISCHARGE PATH GENERATOR FOR GLOBAL I/O LINES

(75) Inventor: Dae-Hee Jung, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 253 days.

(21) Appl. No.: 12/700,437

(22) Filed: Feb. 4, 2010

(65) Prior Publication Data

US 2010/0202189 A1 Aug. 12, 2010

(30) Foreign Application Priority Data

Feb. 11, 2009 (KR) ........................ 10-2009-0011120

(51) Int. Cl.
*G11C 11/24* (2006.01)

(52) U.S. Cl. ............... 365/149; 365/185.25; 365/185.05

(58) Field of Classification Search .................. 365/149, 365/185.25, 185.05
See application file for complete search history.

(56) References Cited

U.S. PATENT DOCUMENTS

| 6,147,925 | A  | * | 11/2000 | Tomishima et al. ..... 365/230.03 |
| 7,050,351 | B2 | * | 5/2006  | Halbert et al. ........... 365/230.03 |
| 7,305,516 | B2 | * | 12/2007 | Lee et al. ...................... 365/194 |
| 2001/0002886 | A1 | * | 6/2001 | Ooishi .......................... 365/196 |
| 2003/0156486 | A1 | * | 8/2003 | Tanaka ..................... 365/230.03 |

FOREIGN PATENT DOCUMENTS

| JP | 2000-311489    | 11/2000 |
| KR | 1020010077080  | 8/2001  |
| KR | 1020060054613  | 5/2006  |

* cited by examiner

*Primary Examiner* — Tuan T. Nguyen
(74) *Attorney, Agent, or Firm* — F. Chau & Associates, LLC

(57) ABSTRACT

A data path circuit includes a bit line sense amplifier, a local input/output line precharger connected to a local input/output line pair, a global input/output line precharger connected to a global input/output line pair, a column selector connecting a bit line pair connected to the bit line sense amplifier and the local input/output line pair to each other in response to a column selection signal, and a local input/output line selector connecting the local input/output line pair and the global input/output line pair to each other in response to a multiplexing control signal. A discharge path generator decreases the potential on the global input/output line pair down to a predetermined level in response to a data masking control signal which is activated earlier than the column selection signal during a data masking operation mode.

14 Claims, 5 Drawing Sheets

SEMICONDUCTOR MEMORY DEVICE HAVING A DISCHARGE PATH GENERATOR FOR GLOBAL I/O LINES

CROSS-REFERENCE TO RELATED APPLICATION

This application claims priority to and the benefit of Korean Patent Application 10-2009-0011120, filed on Feb. 11, 2009, in the Korean Intellectual Property Office, the entire content of which is incorporated by reference herein.

BACKGROUND

1. Technical Field

The present disclosure relates to semiconductor memory devices, and in particular, to a data path circuit for a semiconductor memory device, such as a dynamic random access memory (DRAM), or the like.

2. Discussion of the Related Art

A DRAM which is often used as a main memory in an electronic system has a high operating speed and is highly integrated according to the users' demands.

Such a DRAM is a volatile memory which has a plurality of memory cells, each typically including one access transistor and one storage capacitor. The DRAM has a refresh operation as well as a read/write operation.

High-performance DRAMs with an improved operating speed, such as the Synchronous DRAM (SDRAM), the Double Data Rate (DDR) SDRAM, the Fast Cycle RAM (FCRAM), and the like, have been developed at present. Of these, the SDRAM is configured such that data input/output is possible at either the rising edge or the falling edge of the clock. On the other hand, the DDR SDRAM is configured such that data input/output is possible at the rising edge and the falling edge of the clock, so the DDR SDRAM has a data transmission speed two times higher than that of the SDRAM. Further, the DDR SDRAM includes a data input/output pin, e.g., a Data Input/Output Masking (DQM) Pin, for masking data undesired to be written when a data write command is generated. When a data masking signal is activated, data input/output is disabled in accordance with predetermined latency.

The data masking operation which is widely used in the DDR type DRAM is performed by a Data Masking (DM) circuit which enables a data masking control signal in response to a write inhibition signal input from the outside through a DM pin. In this case, write data is not supplied to a memory cell into which it is undesired to write data, so the data masking operation is realized.

During the data masking operation mode while the write operation is being executed, the electric charges on the global input/output lines may be applied to the bit line connected to the relevant memory cell, which can cause bit line disturbance. The bit line disturbance can cause data stored in advance in the selected memory cell to be affected, such that a read error can occur during the data read operation.

Accordingly, there is a need for a technique for minimizing or eliminating such bit line disturbance during the data masking operation mode while the write operation is being executed.

SUMMARY

Exemplary embodiments of the inventive concept provide a semiconductor memory device capable of minimizing or eliminating a problem regarding bit line disturbance during a data masking operation mode while a write operation is being executed.

Exemplary embodiments of the inventive concept provide a data path circuit for a semiconductor memory device capable of allowing a data masking operation to be reliably performed.

Exemplary embodiments of the inventive concept provide a precharge scheme for global input/output lines capable of minimizing bit line disturbance and also allowing a low-voltage high-speed operation for a high-speed semiconductor memory.

In accordance with an exemplary embodiment, a data path circuit for a semiconductor memory device includes a bit line sense amplifier, a local input/output line precharger connected to a local input/output line pair, a global input/output line precharger connected to a global input/output line pair, a column selector that operationally connects a bit line pair connected to the bit line sense amplifier and the local input/output line pair to each other in response to a column selection signal, and a local input/output line selector that operationally connects the local input/output line pair and the global input/output line pair to each other in response to a multiplexing control signal. A discharge path generator is configured to decrease the potential on the global input/output line pair down to a predetermined level in response to a data masking control signal which is activated earlier than the column selection signal during a data masking operation mode.

The data path circuit may further include a local input/output line sense amplifier connected between the local input/output line pair and the global input/output line pair.

The discharge path generator may include a discharge adjustment execution unit connected between the global input/output line pair and a ground voltage and configured to decrease the potential on the global input/output line pair down to a predetermined level in response to the data masking control signal, and a disabling execution unit that disables the operation of the global input/output line precharger during the activation period of the data masking control signal in response to an activation signal for the local input/output line precharger and the data masking control signal.

The data masking operation mode may be performed during a write operation of a dynamic random access memory.

The discharge adjustment execution unit may include first N-type MOS transistors that each have a drain connected to the global input/output line pair, and a gate to which the data masking control signal is input, second N-type MOS transistors that each have a drain connected to the source of a corresponding one of the first N-type MOS transistors, and a gate and a source connected to each other, and third N-type MOS transistor that each have a drain connected to the source of a corresponding one of the second N-type MOS transistors, and a gate and a source connected in common to the ground voltage.

The disabling execution unit may include a NOR gate that receives the activation signal for the local input/output line precharger and the data masking control signal and that generates a NOR response, and an inverter that inverts the NOR response to disable the operation of the global input/output line precharger.

In accordance with an exemplary embodiment a semiconductor memory device includes a memory cell array which has a plurality of memory cells arranged in a matrix of rows and columns, each memory cell having an access transistor and a storage capacitor, a bit line sense amplifier connected to a bit line pair to which the memory cells are connected, a local input/output line precharger connected to a local input/output line pair, a global input/output line precharger connected to a global input/output line pair, a column selector that operationally connects a bit line pair connected to the bit line sense amplifier and the local input/output line pair to each other in response to a column selection signal, and a local input/output line selector that operationally connects the local input/output line pair and the global input/output line pair to each other in response to a multiplexing control signal. A discharge path generator is configured to decrease the potential on the global input/output line pair down to a predetermined level in response to a data masking control signal that is activated earlier than the column selection signal during a data masking operation mode.

The discharge path generator of the semiconductor memory device includes a discharge adjustment execution unit connected between the global input/output line pair and a ground voltage and configured to decrease the potential on the global input/output line pair down to a predetermined level in response to the data masking control signal, and a disabling execution unit that disables the operation of the global input/output line precharger during the activation period of the data masking control signal in response to an activation signal for the local input/output line precharger and the data masking control signal.

The discharge adjustment execution unit of the semiconductor memory device may include first N-type MOS transistors that each have a drain connected to the global input/output line pair, and a gate to which the data masking control signal is input, second N-type MOS transistors that each have a drain connected to the source of a corresponding one of the first N-type MOS transistors, and a gate and a source connected to each other, and third N-type MOS transistor that each have a drain connected to the source of a corresponding one of the second N-type MOS transistors, and a gate and a source connected in common to the ground voltage.

The disabling execution unit of the semiconductor memory device may include a NOR gate that receives the activation signal for the local input/output line precharger and the data masking control signal and that generates a NOR response, and an inverter that inverts the NOR response to disable the operation of the global input/output line precharger.

In accordance with an exemplary embodiment a discharge path generator is provided for a data path circuit coupled to a complementary bit line pair of a memory cell, the complementary bit line pair being coupled to a global input/output line pair through a column selector circuit enabled by a column selection signal and through a local input/output selection circuit enabled by a multiplexing control signal. The discharge path generator includes a first branch circuit coupled between a first line of the global input/output line pair and ground, and a second branch circuit coupled between a second line of the global input/output line pair and ground. The first branch circuit is configured to discharge to ground prior to the column selector circuit being enabled by the column selection signal and the local input/output selection circuit being enabled by the multiplexing control signal, electric charges formed on the first line of the global input/output line pair during a data masking operation mode while a write operation is being executed. The second branch circuit is configured to discharge to ground prior to the column selector circuit being enabled by the column selection signal and the local input/output selection circuit being enabled by the multiplexing control signal, electric charges formed on the second line of the global input/output line pair during the data masking operation mode while the write operation is being executed.

The data path circuit may include a global input/output precharge circuit coupled between the first line of the global input/output line pair and the second line of the global input/output line pair, that precharges the global input/out line pair during the write operation. The discharge path generator may further include a disabling execution unit configured to disable the global input/output precharge circuit and put the global input/output line pair in a high impedance state during the data masking operation mode.

The first branch circuit may include a first branch first N-type MOS transistor which has a drain connected to the first line of the global input/output line pair and a gate to which a data masking control signal is input, a first branch second N-type MOS transistor which has a drain connected to the source of the first branch first N-type MOS transistor, and a gate and a source connected to each other, and a first branch third N-type MOS transistor which has a drain connected to the source of the first branch second N-type MOS transistor, and a gate and a source connected in common to the ground voltage. The second branch circuit may include a second branch first N-type MOS transistor which has a drain connected to the second line of the global input/output line pair and a gate to which the data masking control signal is input, a second branch second N-type MOS transistor which has a drain connected to the source of the second branch first N-type MOS transistor, and a gate and a source connected to each other, and a second branch third N-type MOS transistor which has a drain connected to the source of the second branch second N-type MOS transistor, and a gate and a source connected in common to the ground voltage.

The data path circuit may include local input/output precharge circuit coupled to the local input/output selector circuit, and the disabling execution unit may include a NOR gate followed in series by an inverter, the NOR gate having an input comprising an activation signal for the local input/output precharge circuit and the data masking control signal, the inverter having an output coupled to the global input/output line precharge circuit.

BRIEF DESCRIPTION OF THE DRAWINGS

Exemplary embodiments of the present inventive concept will now be described in detail with reference to the attached drawings in which.

DETAILED DESCRIPTION OF THE EMBODIMENTS

Figure 1:
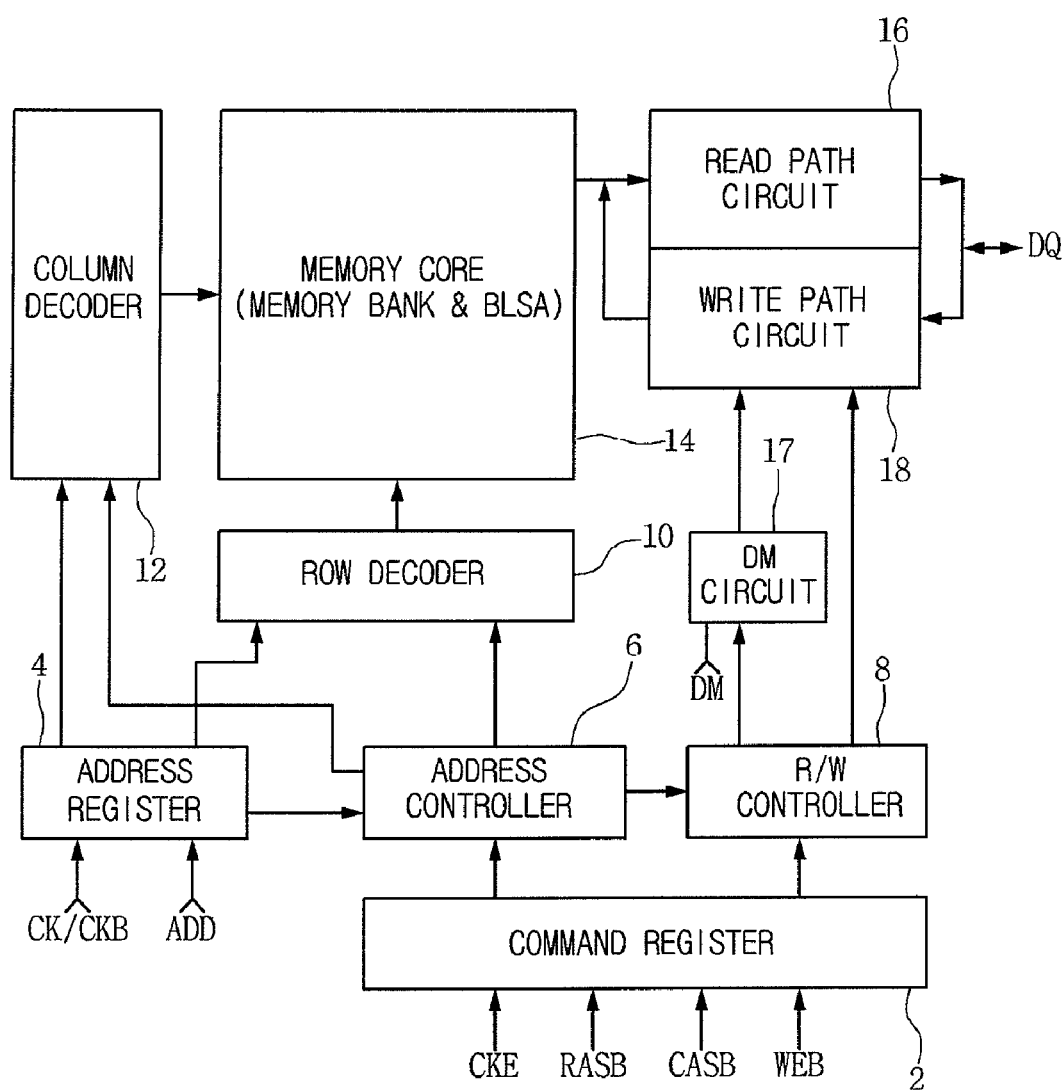
FIG. 1 is a block diagram showing the configuration of a typical semiconductor memory device.

Exemplary embodiments of the inventive concept are shown by way of example in the drawings and will herein be described below in detail. Like numbers refer to like elements throughout the description of the figures. However, the configuration and basic operation of the typical DRAM or its internal circuits are well known to those skilled in the art and will not be described in further detail.

It should be understood, however, that there is no intent to limit the exemplary embodiments to the particular forms disclosed, but on the contrary, can include all modifications, equivalents, and alternatives falling within the scope of the inventive concept.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of exemplary embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

FIG. 1 is a block diagram showing the configuration of a typical semiconductor memory device, which is applicable to the embodiment of the inventive concept. Referring to FIG. 1, the semiconductor memory device includes a command register 2, an address register 4, an address controller 6, a read/write controller 8, a data masking circuit 17, a row decoder 10, a column decoder 12, a memory core 14, a read path circuit 16, and a write path circuit 18.

The command register 2 receives a clock enable signal CKE, a row address strobe signal RASB, a column address strobe signal CASB, and a write enable signal WEB, and applies a command signal to the address controller 6 and the read/write controller 8. The address register 4 stores an applied address ADD in response to a clock CK/CKB, and applies the address to the row decoder 10 and the column decoder 12 as a row address and a column address.

The memory core 14 includes a bit line sense amplifier (in FIG. 2, indicated by reference numeral 13) connected to a bit line pair, and a memory cell array (in FIG. 2, indicated by reference numeral 11) which has a plurality of memory banks, each memory bank having memory cells MC arranged in a matrix at intersections of word lines and bit lines. Each memory cell has one access transistor AT and one storage capacitor SC.

The address controller 6 generates an address for data access and controls a refresh operation for data preservation. The row decoder 10 is connected to the address controller 6 and decodes a row address so as to activate a selected word line.

Figure 2:
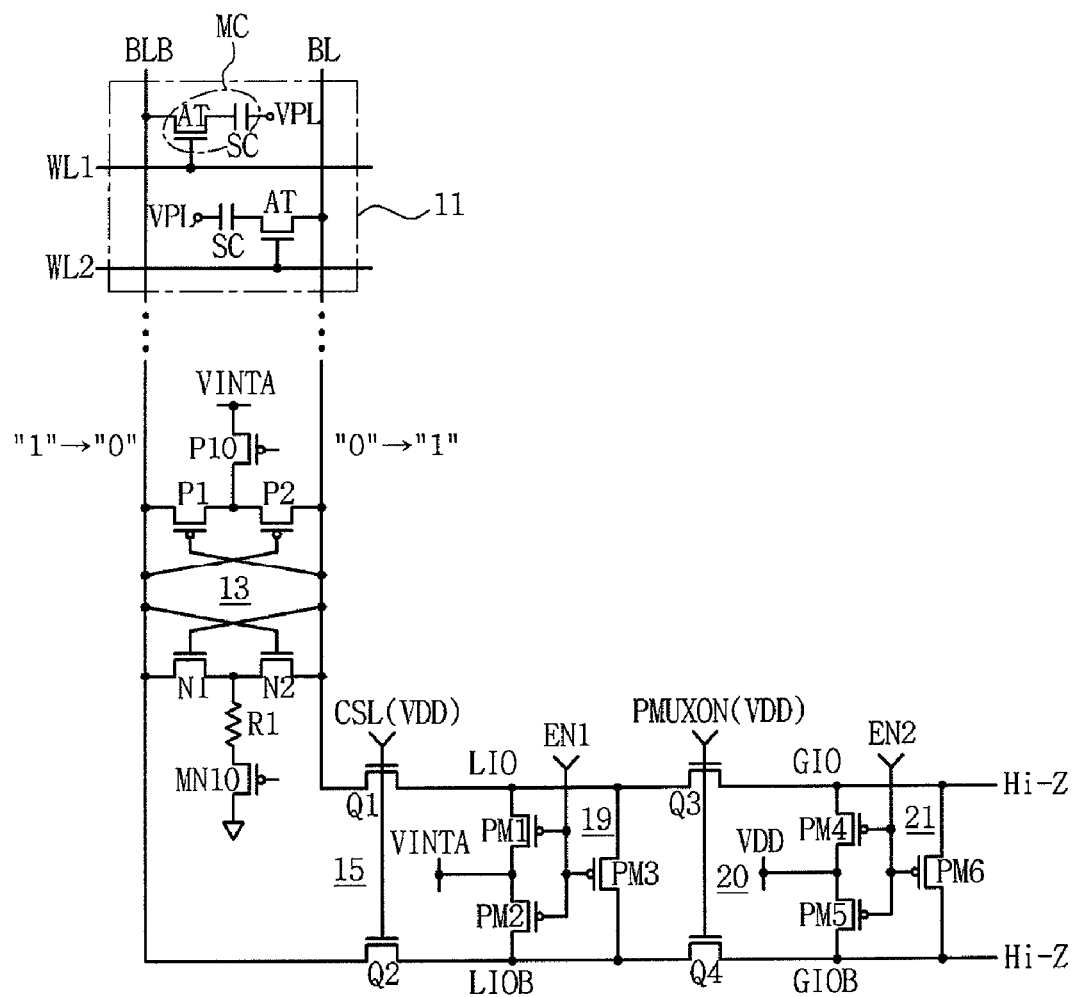
FIG. 2 is a circuit diagram of a data path circuit showing a conventional precharge scheme for global input/output lines.

The read path circuit 16 and the write path circuit 18 of the data path circuit include a local input/output line precharger 19 and a global input/output line precharger 21 shown in FIG. 2, and a global input/output line sense amplifier and an output buffer (not shown). The write path circuit 18 includes an input buffer, a global input/output line driver, and a local input/output line driver (not shown).

Referring to FIG. 1, the data masking (DM) circuit 17 enables a DM control signal in response to a write inhibition signal DM input from the outside through the DM pin. The DM circuit 17 may include a domain crossing circuit and a clocked inverter. The term "domain crossing" means a conversion from a receiver domain to a transmitter domain, a conversion from a domain where a read command is recognized to a domain where output data DQ, DQS, DQSB is output in synchronization with an external clock, and a conversion from an internal clock to a delay locked loop clock. Thus, the domain crossing circuit can change DM data, which has had a transition to the Bidirectional data strobe (DQS) domain, so as to have transition in synchronization with an external clock. The clocked inverter performs an inversion operation in response to an external clock.

Figure 3:
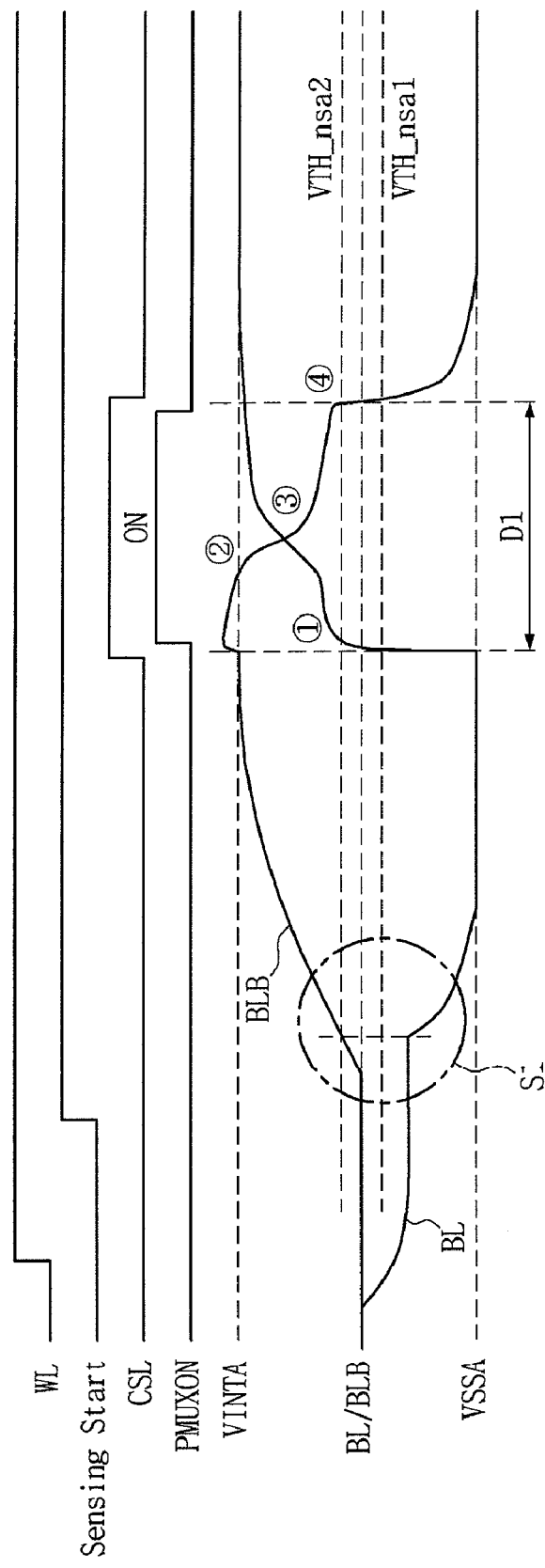
FIG. 3 is a timing chart illustrating the operation of the data path circuit shown in FIG. 2.

FIG. 2 is a circuit diagram of a data path circuit showing a precharge scheme for global input/output lines according to the related art. FIG. 3 is a timing chart illustrating the operation of the data path circuit shown in FIG. 2.

As depicted in FIG. 2, the memory cell array 11, the bit line sense amplifier 13, the column selector 15, the local input/output line precharger 19, the local input/output line selector 20, and the global input/output line precharger 21 are connected to each other.

The memory core 14 of FIG. 1 includes the memory cell array 11, the bit line sense amplifier 13, and the column selector 15, but for convenience, in FIG. 2, it is assumed that the data path circuit includes the bit line sense amplifier 13 and the column selector 15, excluding the memory cell array 11. The data path circuit basically means a concept including the read path circuit 16 and the write path circuit 18 of FIG. 1.

In FIG. 2, each memory cell MC in the memory cell array 11 includes an access transistor AT and a storage capacitor SC. Word lines WL1, WL2 are connected to the gates of the access transistors AT of the memory cells MC, and each of a bit line BL and a complementary bit line BLB forming a bit line pair is connected to the drain/source of the access transistor AT.

The bit line sense amplifier 13 is connected to the bit line pair to sense and amplify a potential difference on the bit line pair based on data stored in the selected memory cell MC of the memory cell array 11 during the read operation.

The column selector 15 operationally connects the bit line pair BL, BLB and a local input/output line pair LIO, LIOB to each other in response to a column selection signal CSL. Thus, sensed and amplified data on the bit line pair BL, BLB during the read operation is transferred to the local input/output line pair LIO, LIOB. The local input/output line pair LIO, LIOB is precharged to an array internal power voltage VINTA by the local input/output line precharger 19 during a precharge operation mode, not during the read or write operation.

The local input/output line selector 20 operationally connects the local input/output line pair LIO, LIOB and the global input/output line pair GIO, GIOB in response to a multiplexing control signal PMUXON. Thus, during the read operation, data on the local input/output line pair LIO, LIOB is transferred to the global input/output line pair GIO, GIOB. During the write operation, as the local input/output line selector 20 is activated, write data supplied to the global input/output line pair GIO, GIOB is transferred to the local input/output line pair LIO, LIOB.

The global input/output line pair GIO, GIOB is precharged to a power supply voltage VDD by the global input/output line precharger 21 during the precharge operation mode, not the read or write operation. During the data masking operation mode while the write operation is being executed, the global input/output line precharger 21 is disabled, and the global input/output line pair GIO, GIOB is put in a state in which no power is supplied, that is, in a floating state, and consequently, is put in a high impedance state.

In the case of the data path circuit for the DRAM shown in FIG. 2, during the data masking operation mode while the write operation is being executed, electric charges on the global input/output lines are applied to the bit lines connected to the memory cell, such that, as shown in FIG. 3, bit line disturbance can occur.

Referring to FIG. 3 showing the operational timing of the data path circuit shown in FIG. 2, it can be seen that, during a period D1 in which the data masking operation mode is executed, the potential levels of the bit line pair are inverted.

The reason why bit line disturbance occurs during the period D1 in which the data masking operation mode is executed will be described below in more detail.

It is assumed that a data 1 is stored in a memory cell MC at the upper part of the memory cell array 11 of FIG. 2. Immediately before the data masking operation mode, data on the bit line BL of the bit line pair may be 0, and data on the complementary bit line BLB may be 1. For example, in order to refresh data stored in the memory cell MC, the bit line sense amplifier 13 is operated. In FIG. 3, a reference indication S1 identifies the sensing start of the bit line sense amplifier 13. As seen in FIG. 2, a P-type sense amplifier having P-type MOS transistors P1, P2 is first operated, and if the level of the complementary bit line BLB increases to a level equal to or higher than the threshold voltage of the N-type MOS transistor N2, an N-type sense amplifier starts sensing. Thus, if the sensing operation of the bit line sense amplifier 13 is executed, the level of the complementary bit line BLB increases to the array internal power voltage VINTA, and the level of the bit line BL decreases to the array ground voltage VSSA. As a result, data on the bit line BL becomes 0, and data of the complementary bit line BLB becomes 1.

In this state, as shown in FIG. 3, if the column selection signal CSL and the multiplexing control signal PMUXON are sequentially activated at high level for execution of the data masking operation mode, the level of the bit line BL which has been maintained at the array ground voltage VSSA due to the operation of the N-type MOS transistor N2 is influenced by the electric charges on the global input/output line GIO and starts to rapidly increase, as indicated by reference numeral ①. In this case, while the level of the bit line BL increases toward the array internal power voltage VINTA, the voltage levels of the local input/output line LIO and the global input/output line GIO decrease.

The level of the complementary bit line BLB decreases from the array internal power voltage VINTA due to the turn-on operation of the N-type MOS transistor N1 constituting a part of the N-type sense amplifier, as indicated by reference numeral ②. At this time, the voltage levels of the complementary local input/output line LIOB and the complementary global input/output line GIOB decrease.

If the level of the complementary bit line BLB decreases, the turn-on resistance of the N-type MOS transistor N2 increases. While the increase in the turn-on resistance causes a decrease in the speed of voltage drop on the local input/output line LIO and the global input/output line GIO, the level of the bit line BL passes through a cross point indicated by reference numeral ③ and increases toward the array internal power voltage VINTA.

In this state, with an increasing speed of voltage drop on the complementary bit line BLB, as shown in the period D1 of FIG. 3, it can be seen that the level of the complementary bit line BLB passes through the cross point indicated by reference numeral ③ and is flipped to a level lower than the bit line BL. This phenomenon is called bit line disturbance. As indicated by reference numeral ④, if the column selection signal CSL is disabled, a data restoration operation may be executed, so the level of the complementary bit line BLB decreases to the array ground voltage VSSA.

As described above, if bit line disturbance occurs during the data masking operation mode, data stored in the selected memory cell may be hurt. That is, memory cell data written in the previous write operation cycle may be hurt and a read error may occur.

Accordingly, there is a need for a technique capable of minimizing or eliminating a problem regarding bit line disturbance during the data masking operation mode while the write operation is being executed. An embodiment of the inventive concept implements a data path circuit shown in FIG. 4 to address the problem regarding bit line disturbance which may occur during the data masking operation mode.

Figure 4:
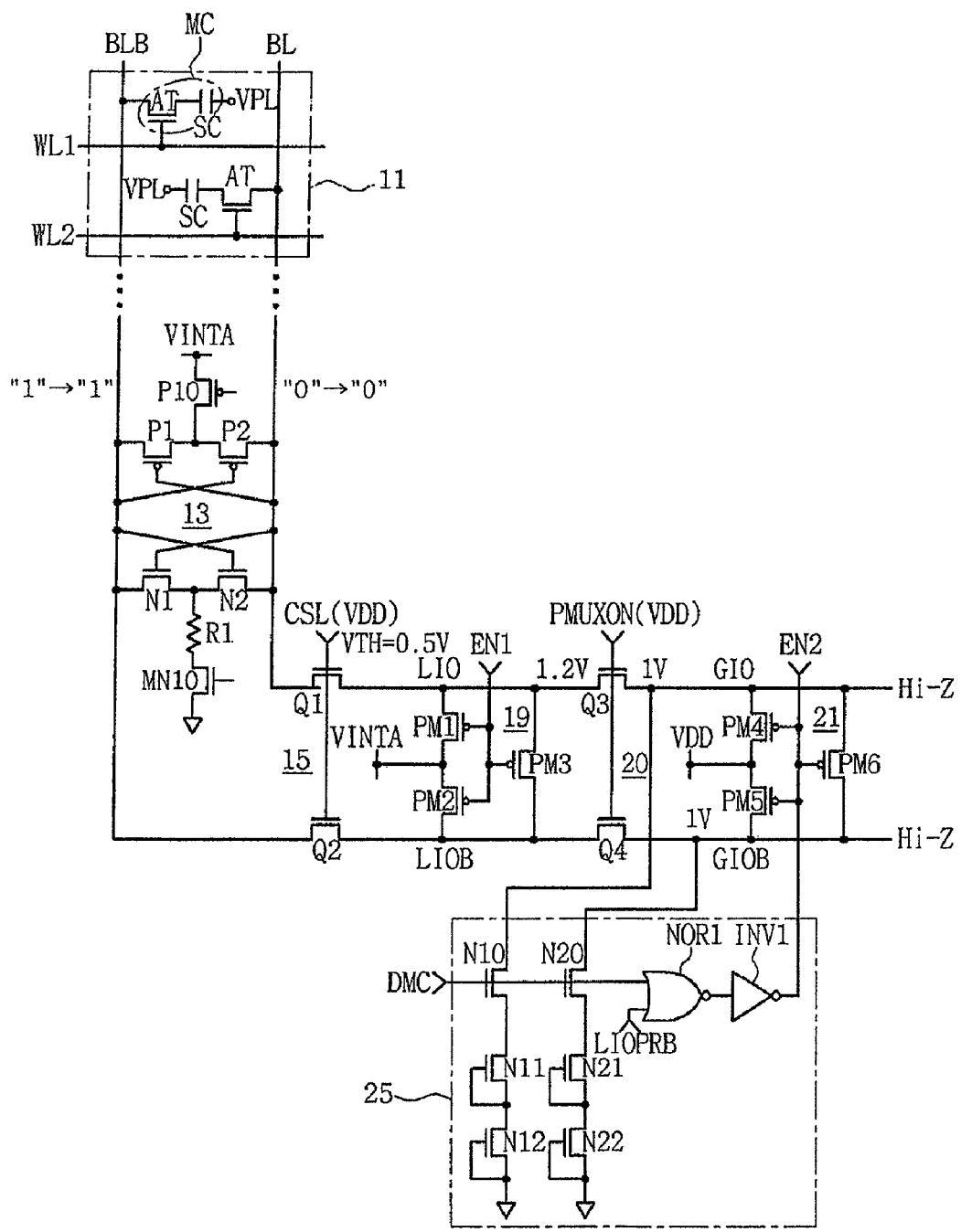
FIG. 4 is a circuit diagram of a data path circuit showing a precharge scheme for global input/output lines according to an exemplary embodiment of the inventive concept.
Figure 5:
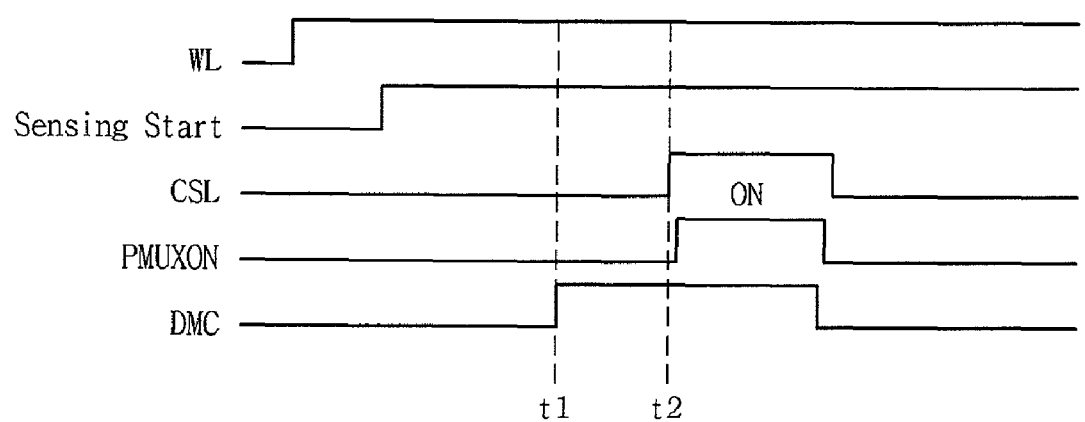
FIG. 5 is a timing chart illustrating the operation of the data path circuit shown in FIG. 4.

FIG. 4 is a circuit diagram of a data path circuit showing a precharge scheme for global input/output lines according to an embodiment of the inventive concept. FIG. 5 is a timing chart illustrating the operation of the data path circuit shown in FIG. 4.

Referring to FIG. 4, the data path circuit includes a bit line sense amplifier 13, a local input/output line precharger 19 connected to a local input/output line pair, a global input/output line precharger 21 connected to a global input/output line pair, a column selector 15 operationally connecting a bit line pair connected to the bit line sense amplifier and the local input/output line pair to each other in response to a column selection signal, a local input/output line selector 20 operationally connecting the local input/output line pair and the global input/output line pair to each other in response to a multiplexing control signal, and a discharge path generator 25.

Unlike the configuration of FIG. 2, a discharge path generator 25 is provided in the configuration depicted in FIG. 4. The discharge path generator 25 includes a discharge adjustment execution unit having N-type MOS transistors N10, N11, N12, N20, N21, N22, and a disabling execution unit having a NOR gate NOR1 and an inverter INV1.

The discharge adjustment execution unit is connected between the global input/output line pair and the ground voltage. The discharge adjustment execution unit decreases the potential of the global input/output line pair GIO, GIOB to a predetermined level in response to the data masking control signal DMC. In this embodiment, when the power supply voltage VDD is equal to or higher than about 1.8 V, the potential of the global input/output line pair GIO, GIOB decreases to about 1 V due to the operation of the discharge adjustment execution unit.

The disabling execution unit disables the operation of the global input/output line precharger 21 during the activation period of the data masking control signal by using an activation related signal LIOPRB for the local input/output line precharger and the data masking control signal DMC.

Referring to FIG. 4, a first branch circuit constituting the discharge adjustment execution unit includes a first N-type MOS transistor N10 which has a drain connected to one input/output line GIO of the global input/output line pair GIO, GIOB and a gate to which the data masking control signal DMC is input, a second N-type MOS transistor N11 which has a drain connected to the source of the first N-type MOS transistor N10, and a gate and a source connected to each other, and a third N-type MOS transistor N12 which has a drain connected to the source of the second N-type MOS transistor N11, and a gate and a source connected in common to the ground voltage.

A second branch circuit includes a first N-type MOS transistor N20 which has a drain connected to the other input/output line GIOB of the global input/output line pair GIO, GIOB and a gate to which the data masking control signal DMC is input, a second N-type MOS transistor N21 which has a drain connected to the source of the first N-type MOS transistor N20, and a gate and a source connected to each other, and a third N-type MOS transistor N22 which has a drain connected to the source of the second N-type MOS transistor N21, and a gate and a source connected in common to the ground voltage.

Still referring to FIG. 4, the NOR gate NOR1 constituting a part of the disabling execution unit receives the activation related signal LIOPRB for the local input/output line precharger and the data masking control signal DMC, and generates a NOR response. The inverter INV1 inverts the output of the NOR gate NOR1 so as to disable the operation of the global input/output line precharger 21.

According to the exemplary embodiment of the inventive concept, the data masking operation mode is executed during the write operation of the DRAM. In this case, as the waveform DMC of FIG. 5, a signal which is changed to high level at the time point t1 is applied through the DM pin. Thus, the discharge path generator 25 of FIG. 4 receives the data masking control signal DMC. That is, the data masking control signal DMC is activated earlier than the time at which the column selection signal CSL is activated during the data masking operation mode.

Referring to FIG. 4, a local input/output sense amplifier may be further provided between the local input/output line pair LIO, LIOB and the global input/output line pair GIO, GIOB. The typical global input/output sense amplifier and local and global input/output drivers are not shown in FIG. 4.

The bit line sense amplifier 13 includes P-type and N-type sense amplifiers. The P-type sense amplifier includes two P-type MOS transistors P1, P2, and the N-type sense amplifier includes two N-type MOS transistors N1, N2. A P-type MOS transistor P10 connected to the P-type sense amplifier serves as a drive transistor for driving the P-type sense amplifier. A drive signal LAPG is typically applied to the gate of the P-type MOS transistor P10. An N-type MOS transistor MN10 connected to the N-type sense amplifier serves as a drive transistor for driving the N-type sense amplifier. A drive signal LANG is typically applied to the gate of the N-type MOS transistor MN10. A resistor R1 connected to the drain of the N-type MOS transistor MN10 is parasitic resistance which is generated due to direct contact during the manufacturing process.

The local input/output line precharger 19 includes three P-type MOS transistors PM1, PM2, PM3, and the global input/output line precharger 21 includes three P-type MOS transistors PM4, PM5, PM6. The array internal power voltage VINTA which is applied to the source of the P-type MOS transistor PM1 of the local input/output line precharger 19 is lower than the power supply voltage VDD, which is applied to the source of the P-type MOS transistor PM4 of the global input/output line precharger 21, by about 0.6 V.

The local input/output line precharger 19 precharges the local input/output line pair LIO, LIOB to the array internal power voltage VINTA in response to a local precharge and equalization control signal EN1 during the precharge operation mode.

The global input/output line precharger 21 precharges the global input/output line pair GIO, GIOB to the power supply voltage VDD during the precharge operation mode.

The column selector 15 includes two N-type MOS transistors Q1, Q2 to the gates of which the column selection signal CSL is input in common.

The local input/output line selector 20 includes two N-type MOS transistors Q3, Q4 to the gates of which the multiplexing control signal PMUXON is input in common.

Hereinafter, the resolution of a typical bit line disturbance which may occur during the data masking operation mode while the write operation is being executed will be described with reference to FIGS. 4 and 5.

During a write operation, the global input/output line pair GIO, GIOB is precharged to the power supply voltage VDD of about 1.8 V, and during the data masking operation mode, the output of the inverter INV1 of the discharge path generator 25 is at high level. Thus, the global input/output line precharger 21 is disabled due to the high level output, and the global input/output line pair GIO, GIOB is put in an impedance state.

Referring to FIG. 5, prior to the time point t2 at which the column selection signal CSL is activated, at the time point t1, the data masking control signal DMC at high level is applied, so the first branch circuit (N10, N11, N12) and the second branch circuit (N20, N21, N22) for discharging constituting the discharge adjustment execution unit are driven. In the case of the first branch circuit, if the N-type MOS transistor N10 is turned on, the electric charges on the global input/output line GIO start to be discharged to the ground through the diode-coupled N-type MOS transistors N11, N12. Similarly, if the N-type MOS transistor N20 is turned on, the electric charges on the complementary global input/output line GIOB start to be discharged to the ground through the diode-coupled N-type MOS transistors N21, N22. When this happens, the potential of the global input/output line pair GIO, GIOB decreases to about 1 V. For this reason, at the time point t2, when the column selection signal CSL and the multiplexing control signal PMUXON are activated, the decreased potential of the global input/output line GIO drops by the threshold voltage of the transistors Q3, Q1 and is applied to the bit line BL, such that the electric charges on the global input/output line GIO have no influence on the bit line BL. Therefore, bit line disturbance is basically blocked.

As described above, according to the exemplary embodiment of the inventive concept, bit line disturbance which occurs due to electric charge transfer from the global input/output line to the bit line during the data masking operation mode while the write operation is being executed is minimized.

Although the embodiment of inventive concept has been described with reference to the drawings, it will be understood by those skilled in the art that various modifications or changes may be made within the technical spirit and scope of the inventive concept. For example, For example, in some cases, the internal configuration or signal timing of the discharge path generator may be modified without departing from the technical spirit and scope of the inventive concept.

Although in the above-described exemplary embodiment, a DRAM has been described, the technical spirit of the inventive concept may be applied to a volatile semiconductor memory, such as a pseudo SRAM or the like, having a data masking operation mode.

What is claimed is:

1. A data path circuit for a semiconductor memory device comprising:
    a bit line sense amplifier;
    a local input/output line precharger connected to a local input/output line pair;
    a global input/output line precharger connected to a global input/output line pair;
    a column selector that operationally connects a bit line pair connected to the bit line sense amplifier and the local input/output line pair to each other in response to a column selection signal;

a local input/output line selector that operationally connects the local input/output line pair and the global input/output line pair to each other in response to a multiplexing control signal; and a discharge path generator that decreases the potential on the global input/output line pair down to a predetermined level in response to a data masking control signal which is activated earlier than the column selection signal during a data masking operation mode.

2. The data path circuit of claim 1, further comprising:
a local input/output line sense amplifier connected between the local input/output line pair and the global input/output line pair.

3. The data path circuit of claim 1, wherein the discharge path generator includes:
a discharge adjustment execution unit connected between the global input/output line pair and a ground voltage and configured to decrease the potential on the global input/output line pair down to a predetermined level in response to the data masking control signal; and
a disabling execution unit that disables the operation of the global input/output line precharger during the activation period of the data masking control signal in response to an activation signal for the local input/output line precharger and the data masking control signal.

4. The data path circuit of claim 1, wherein the data masking operation mode is performed during a write operation of a dynamic random access memory.

5. The data path circuit of claim 3, wherein the discharge adjustment execution unit includes:
first N-type MOS transistors that each have a drain connected to the global input/output line pair, and a gate to which the data masking control signal is input;
second N-type MOS transistors that each have a drain connected to the source of a corresponding one of the first N-type MOS transistors, and a gate and a source connected to each other; and
third N-type MOS transistor that each have a drain connected to the source of a corresponding one of the second N-type MOS transistors, and a gate and a source connected in common to the ground voltage.

6. The data path circuit of claim 3, wherein the disabling execution unit includes:
a NOR gate that receives the activation signal for the local input/output line precharger and the data masking control signal and that generates a NOR response; and
an inverter that inverts the NOR response to disable the operation of the global input/output line precharger.

7. A semiconductor memory device comprising:
a memory cell array which has a plurality of memory cells arranged in a matrix of rows and columns, each memory cell having an access transistor and a storage capacitor;
a bit line sense amplifier connected to a bit line pair to which the memory cells are connected;
a local input/output line precharger connected to a local input/output line pair;
a global input/output line precharger connected to a global input/output line pair;
a column selector that operationally connects a bit line pair connected to the bit line sense amplifier and the local input/output line pair to each other in response to a column selection signal;
a local input/output line selector that operationally connects the local input/output line pair and the global input/output line pair to each other in response to a multiplexing control signal; and a discharge path generator that decreases the potential on the global input/output line pair down to a predetermined level in response to a data masking control signal that is activated earlier than the column selection signal during a data masking operation mode.

8. The semiconductor memory device of claim 7, wherein the discharge path generator includes:
a discharge adjustment execution unit connected between the global input/output line pair and a ground voltage and configured to decrease the potential on the global input/output line pair down to a predetermined level in response to the data masking control signal; and
a disabling execution unit that disables the operation of the global input/output line precharger during the activation period of the data masking control signal in response to an activation signal for the local input/output line precharger and the data masking control signal.

9. The semiconductor memory device of claim 8, wherein the discharge adjustment execution unit includes:
first N-type MOS transistors that each have a drain connected to the global input/output line pair, and a gate to which the data masking control signal is input;
second N-type MOS transistors that each have a drain connected to the source of a corresponding one of the first N-type MOS transistors, and a gate and a source connected to each other; and
third N-type MOS transistor that each have a drain connected to the source of a corresponding one of the second N-type MOS transistors, and a gate and a source connected in common to the ground voltage.

10. The semiconductor memory device of claim 9, wherein the disabling execution unit includes:
a NOR gate that receives the activation signal for the local input/output line precharger and the data masking control signal and that generates a NOR response; and
an inverter that inverts the NOR response to disable the operation of the global input/output line precharger.

11. A discharge path generator for a data path circuit coupled to a complementary bit line pair of a memory cell, the complementary bit line pair being coupled to a global input/output line pair through a column selector circuit enabled by a column selection signal and through a local input/output selection circuit enabled by a multiplexing control signal, the discharge path generator comprising:
a first branch circuit coupled between a first line of the global input/output line pair and ground; and
a second branch circuit coupled between a second line of the global input/output line pair and ground;
wherein:
the first branch circuit is configured to discharge to ground prior to the column selector circuit being enabled by the column selection signal and the local input/output selection circuit being enabled by the multiplexing control signal, electric charges formed on the first line of the global input/output line pair during a data masking operation mode while a write operation is being executed, and
the second branch circuit is configured to discharge to ground prior to the column selector circuit being enabled by the column selection signal and the local input/output selection circuit being enabled by the multiplexing control signal, electric charges formed on the second line of the global input/output line pair during the data masking operation mode while the write operation is being executed.

12. The discharge path generator of claim 11,
wherein the data path circuit includes a global input/output precharge circuit coupled between the first line of the global input/output line pair and the second line of the global input/output line pair, that precharges the global input/out line pair during the write operation, and the discharge path generator further comprising a disabling execution unit configured to disable the global input/output precharge circuit and put the global input/output line pair in a high impedance state during the data masking operation mode.

13. The discharge path generator of claim 11, wherein:
the first branch circuit comprises a first branch first N-type MOS transistor which has a drain connected to the first line of the global input/output line pair and a gate to which a data masking control signal is input, a first branch second N-type MOS transistor which has a drain connected to the source of the first branch first N-type MOS transistor, and a gate and a source connected to each other, and a first branch third N-type MOS transistor which has a drain connected to the source of the first branch second N-type MOS transistor, and a gate and a source connected in common to the ground voltage;

the second branch circuit comprises a second branch first N-type MOS transistor which has a drain connected to the second line of the global input/output line pair and a gate to which the data masking control signal is input, a second branch second N-type MOS transistor which has a drain connected to the source of the second branch first N-type MOS transistor, and a gate and a source connected to each other, and a second branch third N-type MOS transistor which has a drain connected to the source of the second branch second N-type MOS transistor, and a gate and a source connected in common to the ground voltage.

14. The discharge path generator of claim 12, wherein:
the data path circuit includes a local input/output precharge circuit coupled to the local input/output selector circuit, and the disabling execution unit comprises a NOR gate followed in series by an inverter, the NOR gate having an input comprising an activation signal for the local input/output precharge circuit and the data masking control signal, the inverter having an output coupled to the global input/output line precharge circuit.

* * * * *